United States Patent
Maiwald

(10) Patent No.: US 6,882,146 B2
(45) Date of Patent: Apr. 19, 2005

(54) METHOD AND SYSTEM FOR DETERMINING THE ORIENTATION OF MAGNETIC FIELDS BY MEANS OF GMR SENSORS

(75) Inventor: Hubert Maiwald, Salching (DE)

(73) Assignee: Infineon Technologies AG, München (DE)

( * ) Notice: Subject to any disclaimer, the term of this patent is extended or adjusted under 35 U.S.C. 154(b) by 47 days.

(21) Appl. No.: 10/332,190

(22) PCT Filed: Jun. 25, 2001

(86) PCT No.: PCT/EP01/07221
§ 371 (c)(1),
(2), (4) Date: Jan. 6, 2003

(87) PCT Pub. No.: WO02/03089
PCT Pub. Date: Jan. 10, 2002

(65) Prior Publication Data
US 2004/0012389 A1 Jan. 22, 2004

(30) Foreign Application Priority Data
Jul. 5, 2000 (EP) .............................. 00114447

(51) Int. Cl.[7] .............................................. G01R 33/02
(52) U.S. Cl. .................. 324/252; 324/207.21; 324/225; 702/150
(58) Field of Search .............................. 324/207.21, 224, 324/225, 247, 252; 33/355 R, 356; 702/92, 150, 151

(56) References Cited

U.S. PATENT DOCUMENTS

| | | | | | |
|---|---|---|---|---|---|
| 4,492,923 A | * | 1/1985 | Byram | .................. | 324/207.26 |
| 4,868,497 A | * | 9/1989 | Wallrafen | .................... | 324/160 |
| 5,274,582 A | * | 12/1993 | Whitby | ....................... | 708/807 |
| 5,394,029 A | | 2/1995 | Gay et al. | | |
| 5,519,318 A | * | 5/1996 | Koerner et al. | ............. | 324/252 |
| 5,945,825 A | | 8/1999 | Clemens | | |
| 6,070,333 A | * | 6/2000 | Kutzner et al. | ........... | 33/355 R |
| 6,242,911 B1 | * | 6/2001 | Maschek | ..................... | 324/247 |
| 6,313,627 B1 | * | 11/2001 | Van Den Berg | ............ | 324/252 |
| 6,427,349 B1 | * | 8/2002 | Blank et al. | .................. | 33/356 |

FOREIGN PATENT DOCUMENTS

| | | |
|---|---|---|
| DE | 196 13 402 | 10/1997 |
| DE | 196 19 806 | 11/1997 |
| EP | 0 807 827 | 11/1997 |

* cited by examiner

Primary Examiner—Jay Patidar
(74) Attorney, Agent, or Firm—Schiff Hardin LLP

(57) ABSTRACT

The invention relates to a method and a system for determining the orientation of an external magnetic field by means of giant magneto-resistor (GMR) sensors. A sensor circuit is provided with two or more sub-circuits each having two GMR sensors connected in series. Three respective sensor voltages are obtained and a scaling factor is determined from differences in these voltages. An external magnetic field orientation is determined based on a scaling factor applied to the difference voltages. The inventive method enables signals from the GRM sensors to be reprocessed easily in order to compensate the temperature dependence of the signals.

20 Claims, 4 Drawing Sheets

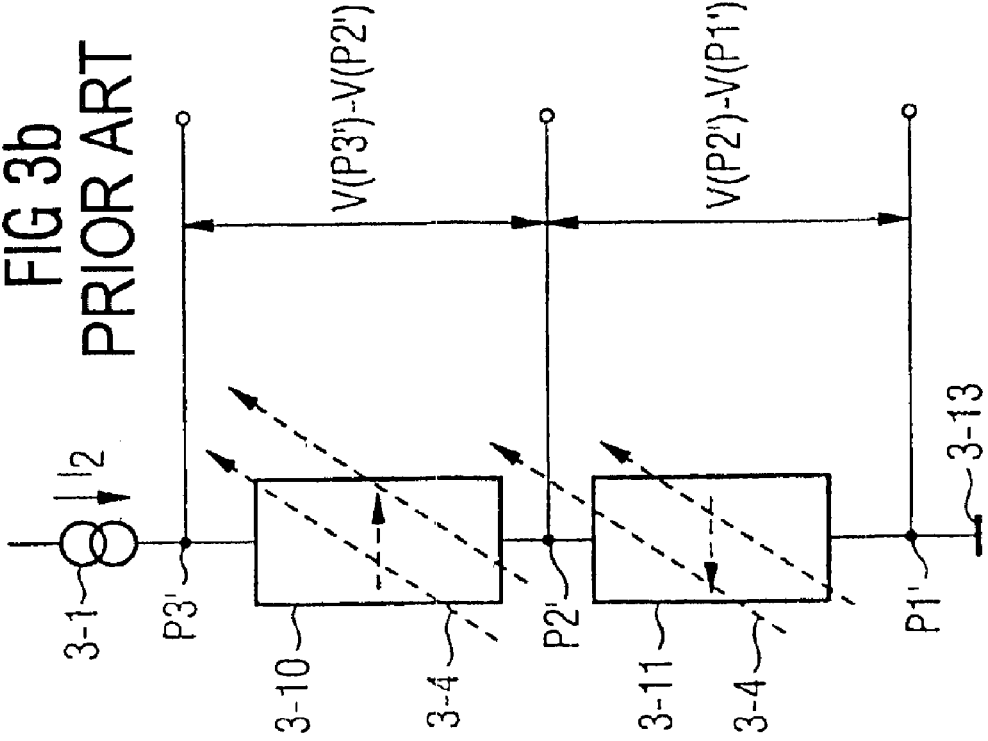
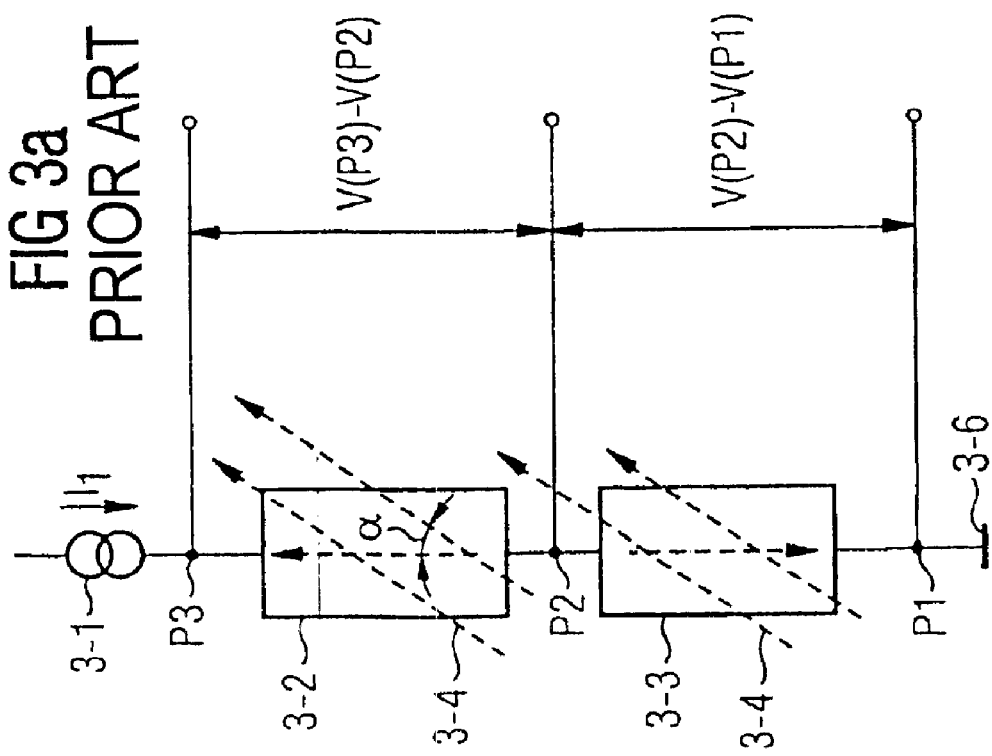

METHOD AND SYSTEM FOR DETERMINING THE ORIENTATION OF MAGNETIC FIELDS BY MEANS OF GMR SENSORS

BACKGROUND OF THE INVENTION

1. Field of the Invention

The invention is directed to a method for determining the orientation of an external magnetic field with giant magneto-resistor (GMR) sensors. The invention is also directed to a system with GMR sensors for determining the orientation of an external magnetic field.

2. Description of the Related Art

GMR sensors were first manufactured in the 1980's. They are distinguished by their high sensitivity of their electrical specific resistance to the orientation of an external magnetic field.

GMR sensors have proven themselves as ideal sensors for non-contacting position and speed measurement of magnetic objects and for the non-contacting measurement of electrical currents. Due to their ruggedness when confronted by harsh environmental influences, they are often utilized in an industrial setting or in the field of automotive electronics. Since the resistance of the GMR sensors is dependent on the orientation of the external magnetic field and, within a broad range, not on the strength of the magnetic field, the GMR sensor can be easily employed for measuring field orientations without the distance between the magnetic source and the GMR sensor having to be exactly adjusted.

There are various embodiments of GMR sensors. FIG. 1 illustrates an embodiment of a GMR sensor illustrated that is composed of very thin anti-ferromagnetic layers that are alternately stacked with very thin, conductive, non-magnetic layers 1-2, for example copper. The uppermost and the bottom layer, i.e., the covering layers 1-1 of the GMR sensor, are composed of a soft anti-ferromagnetic material whose magnetic orientation already aligns in accord with soft, external magnetic fields 1-5 that penetrate the material. The other layers lying between the conductive, non-magnetic layers 1-2 are hard anti-ferromagnetic layers 1-3 that, for example, are composed of cobalt. A magnetic direction can be impressed in hard anti-ferromagnetic layers using a very strong external field, this direction not changing even given moderately strong external fields with a different orientation. The orientation of the anti-ferromagnetic, hard layers 1-3 is impressed once with a very strong external magnetic field (>15 kA/m) and determines the orientation of the internal magnetic field of the GMR sensor and, thus, the internal orientation of the GMR sensor. In order to nonetheless change the internal orientation of the GMR sensors, an external magnetic field of at least the same strength must be applied again.

The variation of the electrical resistance due to a variation of the orientation of an external magnetic (soft) field is based on the fact that the resistance that electrons encounter in magnetic materials is dependent on the angle between spin directions of the electrons and the magnetic field direction of the material. Electrons that have assumed the spin direction of the external magnetic field 1-5 in the soft covering layer 1-1 encounter a low electrical resistance in the hard magnetic layers 1-3 when the internal magnetic field 1-6 of the GMR sensor has the same magnetic orientation as the external magnetic field 1-5. The electrical combined resistance, R, of a GMR sensor is thus composed of a fundamental resistance R0 and an angle-dependent resistance $R1=\frac{1}{2}\Delta R(1-\cos\alpha)$, so that the following equation applies:

$$R(T \cdot \alpha) = R0(T) + \frac{1}{2}\Delta R(T) \times (1 - \cos\alpha). \tag{1}$$

where $\alpha$ is the angle between internal orientation 1-6 of the GMR sensor and the orientation of the external field 1-5 in the plane of the covering layers 1-1, and $\Delta R(T)$ is the maximum magneto-resistive resistance of the GMR sensor.

The parameter T incorporated in Equation (1) indicates that the resistance is somewhat dependent on the temperature of the GMR sensor. Typically, the fundamental resistance increases given increasing temperature, whereas the magneto-resistive resistance drops with the temperature. Typical values for the relative temperature drift of the fundamental resistance R0(T) are approximately 0.05%/K through 0.2%/K and approximately −0.05%/K through −0.2%/K for the relative temperature drift of the magneto-resistive resistance. This temperature dependency causes an angle allocation from a measured resistance to be ambiguous when the temperature varies and is unknown.

Typically, the layers of the GMR sensors are only a few nm thick and are applied onto small substrates with precision techniques, for example sputtering methods. The structures of the GMR sensors are applied onto a substrate with lithographic methods so that a plurality of GMR sensors can also be applied onto the substrate in a small space. The electrical connections between the GMR sensors are often designed in a meandering fashion in order to generate defined resistances on the leads to the GMR sensors.

FIG. 2 shows a simple measuring structure with a GMR sensor of the Prior Art with which the orientation of an external magnetic field can be identified in the plane of the GMR sensor layers without temperature compensation. The measuring structure is composed of a current source 2-1 with a set current I, of a GMR sensor 2-2 with an internal orientation 2-5, as well as of a voltmeter device 2-3 that takes the voltage drop-off V=V(P2)−V(P1) across the GMR sensor at the points P1 and P2. When R0 and ΔR of the GMR sensor are known from preceding calibration measurements, then the angle $\alpha$ between external magnetic field 2-4 and internal orientation 2-5 can be calculated from the measured voltage drop-off with the assistance of Eq. (1). This simple measuring structure, however, has the following disadvantages:

1) the angle measurement is unambiguous only in the region of 180 degrees but not in the full 360 degree range;
2) the magneto-resistive effect, ΔR/R0, generally amounts to only a few percent, so that the voltage measurement is superimposed by a large offset voltage $V_{\mathit{offs}}=R0\times I$; and
3) the temperature dependency of the parameters R0(T) and ΔR(T) does not allow an unambiguous angle determination given an unknown temperature of the GMR sensor.

A significant improvement for avoiding these difficulties is represented by the employment of two series-connected, structurally identical GMR sensors with internal orientation anti-parallel to one another (FIG. 3a and FIG. 3b). FIG. 3a shows the two GMR sensors 3-2 and 3-3 with anti-parallel internal orientation and the current source 3-1 with the set current $I_1$ that flows off to the current sink 3-6 via the points P3, P2 and P1. The external magnetic field 3-4 acting on the GMR sensors describes the angle $\alpha$ with the internal magnetic orientation of the GMR sensor 3-2. The external magnetic field should be the same for both GMR sensors, which is easily met when the spatial extent of the two GMR sensors together is small compared to the spatial structure of the external magnetic field 3-4.

When the anti-parallelism of the GMR sensor 3-3 to the reference GMR sensor 3-2 is taken into consideration, then the following derives from Eq. (1) and FIG. 3a:

$$V(P2)-V(P1)=(R0(T)+\tfrac{1}{2}\Delta R(T)\times(1+\cos\alpha))\times I_1 \quad (2)$$

and $$V(P3)-V(P2)=(R0(T)+\tfrac{1}{2}\Delta R(T)\times(1+\cos\alpha))\times I_1 \quad (3)$$

The difference V1 of the two voltages then supplies:

$$V1=V(P2)-V(P1)-V(P3)+V(P2)=\Delta R(T)\times I_1\times\cos\alpha \quad (4)$$

The employment of two series-connected anti-parallel GMR sensors can thus be utilized by difference formation to eliminate the great (and temperature-dependent) voltage offset R0(T) that occurs in FIG. 2. The difference formation can be realized in a simple way with analog electronic circuits to prevent time delays that occur due to digitalization and digital calculations.

In order to eliminate the ambiguity of the angle determination in the 360 degree range, a second circuit of the type of FIG. 3a may be driven in parallel with the same current source. Such a second circuit is shown in FIG. 3b. Such electronic circuits with GMR sensors for the measurement of the orientation of a magnetic field can, for example, be derived from the German patent document DE 196 19 806. The second circuit comprises GMR sensors 3-10 and 3-11 with the same structure as the first circuit, with the difference that the internal orientations of the two GMR sensors are perpendicular to the farthest-reaching extent to the internal orientations of the GMR sensors of the first circuit. The two circuit must lie close enough together that they essentially encounter the same external magnetic field 3-4. The current source 3-12 generates the current $I_2$ that flows off to the current sink 3-13 via the points P3', P2' and P1'. The voltages V(P2')−V(P1') and V(P3')−V(P2') that form at the points P1', P2' and P3' are subtracted from one another as in FIG. 3a, so that—analogous to Eq. (4)—a second angle-dependent voltage measurement is obtained with $$V2=V(P2')-V(P')-V(P3')+V(P2')=\Delta R(T)\times I_2\times\sin\alpha. \quad (5)$$

By division of Eq. (5) by Eq. (4), a temperature-independent relationship is obtained between the angle α and the measured voltages V1, V2, V1' and V2':

$$\alpha=\arctan(\Delta V'/\Delta V)=\arctan((V1'-V2')/(V1-V2)), \quad (6)$$

where the currents $I_1$ and $I_2$ are assumed to be the same for the sake of simplicity. In order to assure the unambiguousness in the entire 360 degree angle determination, a circuit must be additionally utilized that decides on the basis of V1, V2, V1' and V2' whether the angle is situated in the range between $-\pi/2<\alpha<+\pi/2$ or in the range $-\pi<\alpha<-\pi/2$ or, respectively, $+\pi/2<\alpha<+\pi$.

FIG. 4 shows such an electronic circuit of the Prior Art upon employment of the GMR sensor circuits described in FIG. 3a and FIG. 3b, these being connected in parallel to one another, i.e. P1=P1' and P3=P3'. The first GMR sensor 4-4 and the series-connected, second GMR sensor 4-5, both of which have anti-parallel internal magnetic orientation relative to one another, form the first sensor sub-circuit 4-2; the first GMR sensor 4-6 and the series-connected, second GMR sensor 4-7, which likewise have anti-parallel internal magnetic orientation, form the second sensor sub-circuit 4-3. The internal magnetic orientation of the first sensor sub-circuit 4-2, which is established by the internal magnetic orientation of the first GMR sensor 4-4, is also vertical to the internal magnetic orientation of the second sensor sub-circuit, which is established by the internal magnetic orientation of the first GMR sensor 4-4. The orientation of the external magnetic field 4-14 describes the angle α with the orientation of the internal magnetic field of the first GMR sensor 4-4 of the first sensor sub-circuit 4-2.

Both sensor sub-circuits are supplied by the same current source 4-1. Since the four GMR sensors have essentially the same resistance parameters, the current divides equally onto the two sensor sub-circuits. The two operational amplifiers 4-10 and 4-11 form the difference between the signals V(P2)−V(P4) and V2=V(P2')−V(P4), so that the output signal is freed of offset in the way described above:

$$V1=V(P2)-V(P4)=\tfrac{1}{2}\Delta R(T)\cos\alpha\times I/2 \quad (7)$$

and $$V2=V(P2')-V(P4)=\tfrac{1}{2}\Delta R(T)\sin\alpha\times I/2 \quad (8).$$

The ratio V2/V1 supplies an unambiguous, temperature-independent relationship between angle α and the two measured output signals:

$$\alpha=\arctan(V2/V1) \quad (9).$$

One disadvantage of the relationship indicated in Eq. (6) and Equ. (8), however, is that the calculation of the arctan cannot be accomplished with a simple analog circuit. An approximate linearization is also only possible in a small value range. The calculation therefore generally requires a digitalization of the two output signals with a subsequent calculation of the arctan. The digitalization of the two values, however, is both cost-intensive as well as time-consuming. The digital calculation of the arctan also requires programming, since this function is not implemented in standard micro-controller circuits. This also leads to time delays. Finally, the tangent exhibit infinities in the value range that are handled poorly with a computer.

SUMMARY OF THE INVENTION

The invention is therefore based on the object of providing a method that eliminates or at least reduces the described problems in a simple and fast way particularly the temperature-dependent drift that the output signals of the two series-connected anti-parallel GMR sensor pairs experience. The invention is also based on the object of offering a system with GMR sensors for determining the orientation of an external magnetic field that calculates the temperature drift of the output signals of the two series-connected anti-parallel GMR sensor pairs out in a simple and fast way.

This object is achieved by a method for determining the orientation of an external magnetic field. Inventively, the method for determining the orientation of an external magnetic field with GMR sensors is provided as follows:

a) a sensor circuit having at least a first and a second sensor sub-circuit that are connected parallel to one another is offered, whereby the first and the second sensor sub-circuit each respectively comprise at least a first and a second GMR sensor that are connected in series and that are respectively arranged in opposite internal magnetic orientation, whereby the internal magnetic orientation of the GMR sensors of the first sensor sub-circuit is essentially perpendicular to the internal magnetic orientation of the GMR sensors of the second sensor sub-circuit;

b) respectively three sensor voltages V(P1), V(P2), V(P3) are taken at the points P1, P2 and P3 in the first and the second sensor sub-circuit, whereby P1 lies on the connecting line from the current sink to the second GMR sensor, P2 lies on the connecting line from the second GMR sensor to the first GMR sensor and P3 lies on the connecting line from the first GMR sensor to the current supply;

c) a first difference circuit generates a difference voltage V1 from the three sensor voltages of the first sensor sub-circuit, and a second difference circuit generates a difference voltage V2 from the three sensor voltages of the second sensor sub-circuit;

d) a scaling factor is calculated with the assistance of V1 and V2;

e) V1 and V2 are scaled such with the scaling factor that the orientation of the external magnetic field can be determined from them.

An inventive system with GMR sensors for determining the orientation of an external magnetic field is also provided, with the following features:

a) the system comprises a sensor circuit having a first and a second sensor sub-circuit in which the first sensor sub-circuit is connected parallel to the second sensor sub-circuit and the first and the second sensor sub-circuit each respectively comprise at least a first and a second GMR sensor that are connected in series and that are respectively arranged in opposite internal magnetic orientation relative to one another, and in which the internal magnetic orientation of the GMR sensors of the first sensor sub-circuit is essentially perpendicular to the internal magnetic orientation of the GMR sensors of the second sensor sub-circuit;

b) the first and the second sensor sub-circuit respectively comprise three measuring points P1, P2 and P3, where P1 lies on the connecting line from the current sink to the second GMR sensor, P2 lies on the connecting line from the second GMR sensor to the first GMR sensor and P3 lies on the connecting line from the first GMR sensor to the current supply, so that the three sensor voltages V(P1), V(P2), V(P3) can be taken at the measuring points P1, P2 and P3;

c) the system comprises a first and a second difference circuit, in which the first difference circuit generates a difference voltage V1 from the three sensor voltages of the first sensor sub-circuit, and a second difference circuit generates a difference voltage V2 from the three sensor voltages of the second sensor sub-circuit; and d) the system comprises a scaling circuit that reads out the difference voltage V1 and the difference voltage V2 and scales them such that the orientation of the external magnetic field can be determined from the scaled values.

These inventive embodiments, along with various alternate embodiments, are discussed more fully below.

DESCRIPTION OF THE DRAWINGS

The invention is presented in greater detail below on the basis of FIGS. 5 and 6.

FIGS. 3a–3b are schematic diagrams of sensor sub-circuits with respectively two GMR sensors for the sensor circuit of the Prior Art;

DETAILED DESCRIPTION OF THE INVENTION

Figure 1:
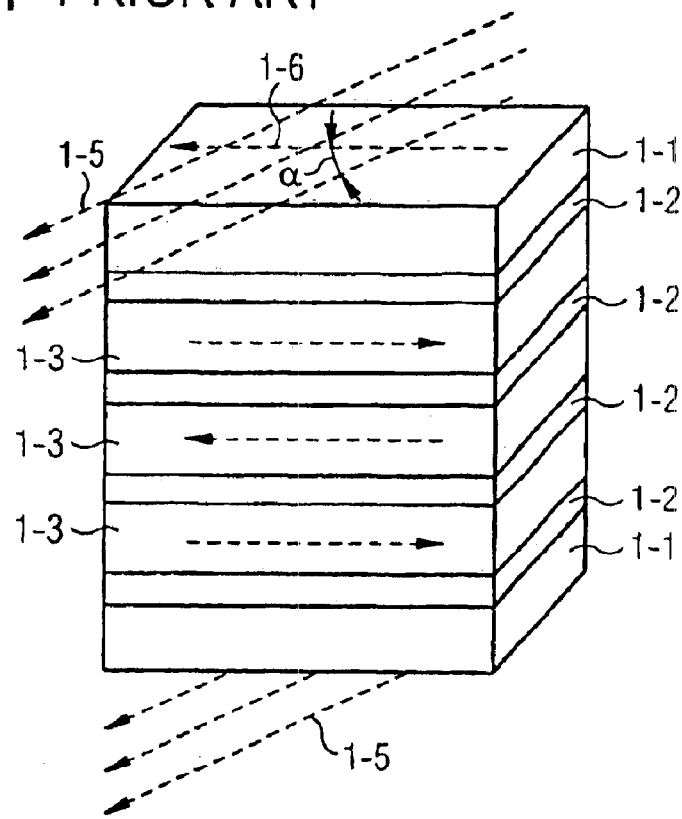
FIG. 1 is a pictorial isometric diagram of a GMR sensor of the Prior Art.
Figure 2:
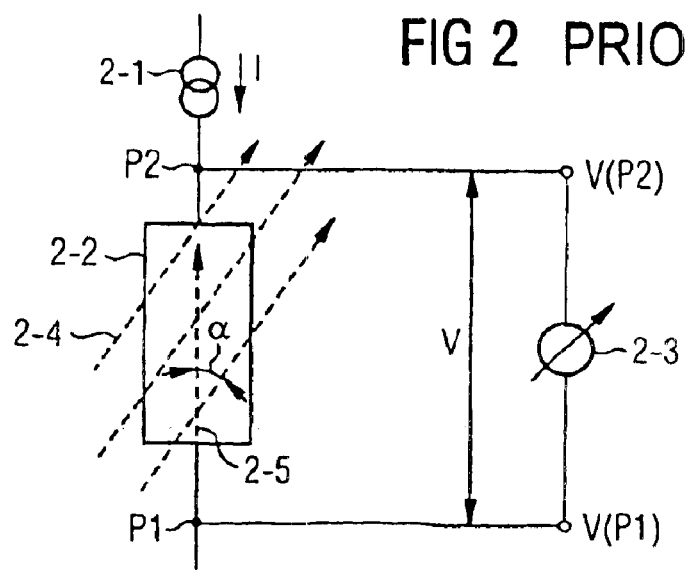
FIG. 2 is a schematic of a basic circuit with a GMR sensor for measuring the orientation of an external magnetic field according to the Prior Art.

With the assistance of four GMR sensors, the inventive method makes it possible to determine the orientation of an external magnetic field that is established by the angle $\alpha$, where the result is temperature-independent because of the scaling, and where the use of arctan and/or arccotan functions can be foregone in the calculation. The use of arctan and/or arccotan functions for calculating the angle $\alpha$ requires a digitalization of the measured values and necessitates the use of programmed microprocessors, which is costly and calculation-intensive. The inventive method, in contrast, only requires the calculation of a scaling factor, that is preferably composed of the square root of the square sum of V1 and V2 or of approximations to this square root. Furthermore, the inventive method largely compensates for negative effects of the unit scatter of the participating GMR sensors.

The scaling with the scaling factor can preferably be realized with analog circuits. The advantage of analog processing of the measured values is comprised in the simplicity and in the superior speed with which the measured values are edited, since time delays due to the analog/digital conversion are sidestepped and the calculating time due to the digital signal processing is avoided.

The orientation of an external magnetic field is established by the angle $\alpha$ between the direction of the external magnetic field and the orientation of the sensor circuit. By definition, let the orientation of the sensor circuit be established below by the internal orientation of the first sensor sub-circuit, where the internal orientation of the first sensor sub-circuit is defined by the internal magnetic orientation of the first GMR sensor. Fundamentally, the orientation of the sensor circuit can also be defined by some other GMR sensor, which changes the inventive method only insignificantly. The addition of an angle constant to the measured value is merely required at the end of a measurement.

The external magnetic field whose orientation is to be identified should preferably exhibit a minimum strength so that the GMR sensor responds. On the other hand, the magnetic strength should not be so large that the internal magnetic orientation that is impressed on every functional GMR sensor is not lost. Typical values for fields that can be measured with GMR sensors lie in the range of 5–10 kA/m. Since the GMR sensors are only sensitive to magnetic field components parallel to the GMR layer planes, this field strength particularly refers to the field components in this plane.

Furthermore, the spatial structure of the external magnetic field should preferably be greater than the region in which the four GMR sensors are accommodated. This assures that the four GMR sensors encounter the same external magnetic field to the farthest-reaching extent, and the output voltage V1 and V2 can be exactly scaled.

There are various GMR sensor types that come into consideration for the sensor circuit. It is critical for the inventive method that the GMR sensors respectively comprise a (hard) internal magnetic field with a permanently impressed magnetic orientation, where the dependency of the GMR sensor resistance on the direction of the external magnetic field must be largely described by Eq. (1). Preferably, the parameters R0(T) and ΔR(T) of the GMR sensors installed in the sensor circuit are identical, or at least very similar, so that the temperature dependency can be compensated as completely as possible by the inventive method.

The GMR sensors of a circuit are preferably of the same type and are preferably applied on a common substrate so that the curve of the parameters R0(T) and ΔR(T) and the prevailing temperature T are optimally the same for all GMR sensors. It is also advantageous when the GMR sensors are as small as possible and lie close to one another so that the overall expanse of the GMR sensor region is small and the GMR sensors thus encounter the same external magnetic field strengths insofar as possible.

The sensor circuit preferably comprises two sensor sub-circuits, each of which has at least two GMR sensors. However, more than two sensor sub-circuits are also conceivable, for example, for redundant measurements. A sensor sub-circuit respectively comprises at least a first and a second GMR sensor that are connected in series with one another and that respectively have an largely anti-parallel internal magnetic orientation relative to one another. However, a sensor sub-circuit can also comprise more than two GMR sensors oriented anti-parallel relative to one another; for example, each GMR sensor can be replaced by two or more GMR sensors oriented parallel to one another. A sensor sub-circuit also preferably comprises series resistors with which, for example, a minimum overall resistance of the sensor sub-circuit can be achieved. This resistance is preferably generated by fashioning meandering lines between the GMR sensors.

The first and second difference circuit respectively generate a difference voltage V1 and V2 from the three sensor voltages V(P1), V(P2) and V(P3). Since the internal orientation of the first sensor sub-circuit is largely perpendicular to the internal orientation of the second sensor sub-circuit, the first difference circuit generates a difference voltage V1 that essentially represents the cosine parts of the orientation of the external magnetic field, whereas the second difference circuit generates a difference voltage V2 that essentially represents the sine parts of the orientation of the external magnetic field. The perpendicular internal orientation of the two sensor sub-circuits relative to one another thus enables the inventive calculation of the scaling factors. What is meant by "perpendicular" is that the angle between the internal orientations of the first sensor sub-circuit and the second sensor sub-circuit can amount both to approximately 90 degrees as well as approximately 270 degrees.

The difference voltages V1 and/or V2 are preferably conducted to a scaling circuit that preferably calculates scaling factors with both values and thus undertakes the scaling of V1 and V2. The orientation of the external magnetic field can be identified temperature-independently from the two scaled V1 and V2 values.

A precise acquisition of the orientation of the external magnetic fields with the assistance of two inventive sensor sub-circuits is also dependent on the constancy of the ratio of the currents through the two sensor sub-circuits. The current through the first sensor sub-circuit and the current through the second sensor sub-circuit are preferably largely the same. In this way, the cosine and the sine parts of the orientation of the external magnetic field are identically weighted, so that the scaling can be correctly implemented given identical difference circuits. Preferably, the equality of the currents is realized in that both sensor sub-circuits exhibit the same resistance coefficients R0(T) and ΔR(T) and both sensor sub-circuits are supplied by a common current source or voltage source so that the currents of both sensor sub-circuits are the same based on Ohm's law even given a varying temperature.

When the two currents are constant but not the same, then a subsequent, compensating weighting of the cosine parts must be implemented, this being preferably realized by different gain factors of the difference circuits.

The scaling is preferably calculated using the square root of the square sum V1 and V2. This is the value with which V1 and/or V2 must be scaled in order to obtain the orientation α of the external magnetic field independently of temperature. Preferably, both V1 as well as V2 are scaled in order to unambiguously identify α on the entire 360 degree range.

The calculation of the scaling factor preferably ensues with an analog circuit since time delay and costs due to the digitalization of the V1 and V2 values can thus be avoided. The digital calculating time for the calculation of the root of the square sum of V1 and V2 is also eliminated. Preferably, the squaring of the V1 and V2 values is implemented parallel with two analog multiplier circuits. The sum of the two squared values is preferably generated in an analog fashion in a further circuit. Finally, the root of the square sum of V1 and V2 is also preferably generated in analog fashion. When only a small angular range is considered for the calculation of α or when only a limited precision of the angle determination is required, then an analog approximation is implemented instead of the square root function, preferably also a constant approximation value, a linear approximation and/or approximations of a higher order. The equation SQRT $(x^2+y^2)=0.96x \rightarrow 0.398y$ with x>y can preferably be employed as a linear approximation.

The root operation can also preferably be digitally implemented, which, despite digitalization, proceeds faster and with less outlay (programmed microprocessor, etc.) than the digitalization and calculation of the arctan or arccotan functions as implemented in methods of the Prior Art for calculating the orientation of an external magnetic field.

The scaling of the V1 and/or V2 values preferably ensues by division of the V1 and/or V2 values by the calculated scaling factor. The division preferably ensues in an analog way in order to eliminate time delays during the digitalization and circuit outlay. The division is unproblematical, particularly because the scaling factor is always greater than 0.

The determination of the orientation angle of the external magnetic field, α, from the scaled V1 and/or V2 values can ensue in various ways. In a preferred version, the arc cosine and/or arc sine is applied to scaled V1 and/or V2 values, so that the following applies:

$$\alpha=\arccos(V1) \text{ and/or a } \alpha=\arcsin(V2) \tag{10}$$

It is disadvantageous that these functions require a greater circuit outlay, including programmed microprocessor and digitalization. In contrast to the arc cotangent and arc tangent, however, these functions have no infinities in the value range.

In another preferred embodiment, there is a table that allocates an angle α to each V1 and/or V2 value. This table can be taken from a calibration measurement or—preferably—from a one-time calculation. Since the scaled V1 and V2 values are temperature-independent, only one table at a particular temperature is required.

The inventive system with sensors, difference circuit and scaling circuit enables a simple acquisition and calculation of the orientation of an external magnetic field, by which the calculation can be implemented completely or largely in analog.

The simplicity of the temperature-compensated calculation of the orientation of an external magnetic field is based on the magnetically anti-parallel arrangement of the GMR sensors in the respective sensor sub-circuits and on the magnetically perpendicular arrangement of the sensor sub-circuits relative to one another. The simplicity of the temperature-compensated calculation is also based on the constancy of the ratio of the currents that flow through the two sensor sub-circuits. Preferably, the current through the first sensor sub-circuit and the current through the second sensor sub-circuit are the same. Both currents are preferably taken from a common current source, where the overall resistance of the first sensor sub-circuit and of the second sensor sub-circuit are largely identical.

The first and the second difference circuit are preferably identical, particularly when the currents through the two sensor sub-circuits are the same. Preferably, the first difference circuit calculates the voltage V1=V(P2)–½V(P3), and the second difference circuit calculates the voltage V2=V(P2')–½V(P3).

The scaling circuit preferably comprises a circuit for calculating the scaling factor; the circuit for calculating the scaling factor preferably calculates the square root of the square sum of V1 and V2. This calculation is preferably implemented in analog, preferably from a circuit that first forms the squares of V1 and V2, then adds these squares and takes the square root of the sum. The root function can also preferably be implemented by a linear and/or square approximation.

The scaling circuit also preferably comprises a circuit for scaling the V1 and/or V2 values. This scaling preferably ensues using an analog processing that respectively divides V1 and/or V2 by the calculated scaling factor.

The scaling circuit also preferably comprises a circuit that implements the allocation of the scaled V1 and/or V2 values to an orientation angle of the external magnetic field. This allocation preferably occurs using a tabular allocation that can be implemented in analog and/or digital. This allocation can also preferably be integrated in an ASIC.

The output voltages V1 and V2 pending at the two sensor sub-circuits are also preferably amplified in analog before the scaling factor is calculated and the scaling is implemented. This measure is especially recommendable given small output voltage signals. This measure also has no diminishing influence on the scaling.

Figure 5:
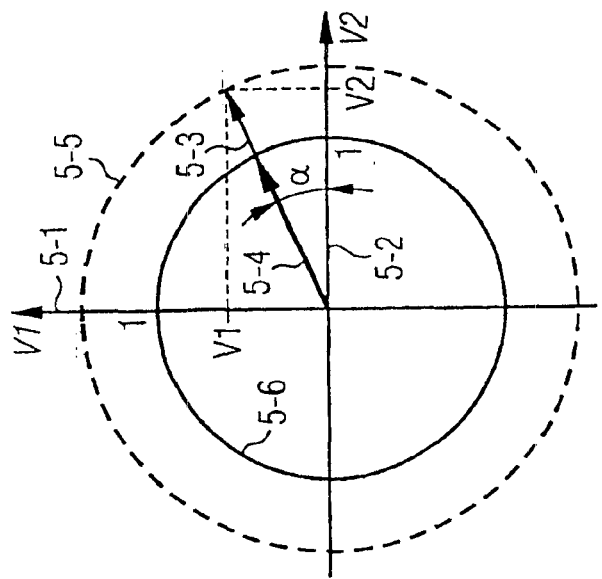
FIG. 5 is a graph illustrating the inventive method for determining the orientation of an external magnetic field.

FIG. 5 shows a graph illustrating an embodiment of the inventive method for determining the orientation of an external magnetic field in that the temperature-dependency of the measurement can be eliminated by scaling with the scaling factor SQRT(V1$^2$+V2$^2$), and the angle of an external magnetic field can thus be measured independent of temperature without having to use the resource-intensive arctan and/or arccot functions.

Figure 4:
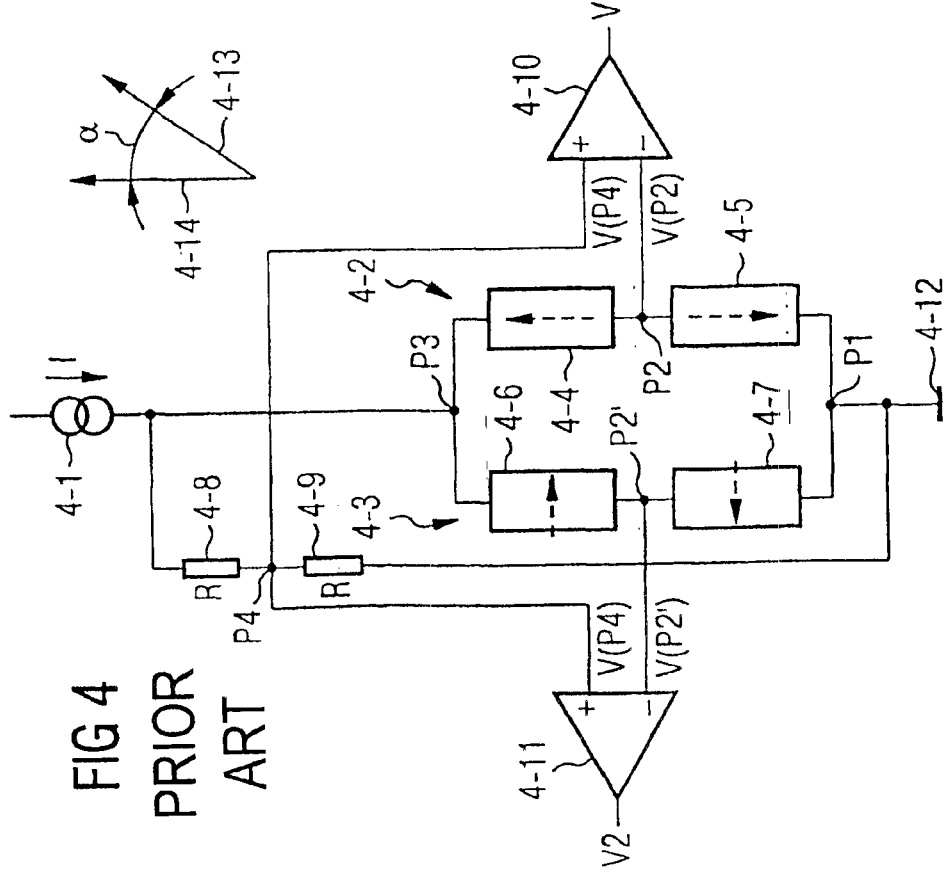
FIG. 4 is a schematic diagram of a sensor circuit with GMR sensors and a difference circuit for determining the orientation of an external magnetic field according to the Prior Art.

A vector $V_m$=(V1, V2) is entered in the orthogonal coordinate system with the V1 axis 5-1 and the V2 axis 5-2, where the vector components V1 and V2 are the measured values from a sensor circuit as shown in FIG. 4. The dotted-line circle 5-5 represents all of the points (V1, V2) that the inventive sensor circuit can reach at a fixed temperature T1 by varying the orientation of an external magnetic field. Since the GMR sensors in both sensor sub-circuits exhibit anti-parallel internal magnetic orientation relative to one another and the sensor sub-circuits have a magnetic orientation that is largely perpendicular to one another, the following applies:

$$V1=\Delta R(T) \times I \times \cos \alpha$$

and $$V2=\Delta R(T) \times I \times \sin \alpha$$

where α is the angle between the orientation of the external magnetic field to be measured and the orientation of the GMR sensor of the first sensor sub-circuit. Since the GMR sensors have the same temperature dependency and the same current I flows through the two sensor sub-circuits, the vector $V_m$ and the vector with the orientation of the external magnetic field lie on one another. A unitary vector 5-4 that lies on the unitary circle 5-6 is generated from $V_m$=(V1, V2) using a scaling with SQRT(V1$^2$+V2$^2$):

$$V_{m0}=(V1/SQRT(V1^2+V2^2), V2/SQRT(V1^2+V2^2))=(\sin \alpha, \cos \alpha)$$

All vectors (V1, V2) can be projected onto the unitary circle using this method so that a table with an allocation of (V1, V2) unitary circle vectors to the angle α suffices in order to be able to allocate an angle for the external magnetic field to each (V1, V2) vector even given an unknown temperature.

Figure 6:
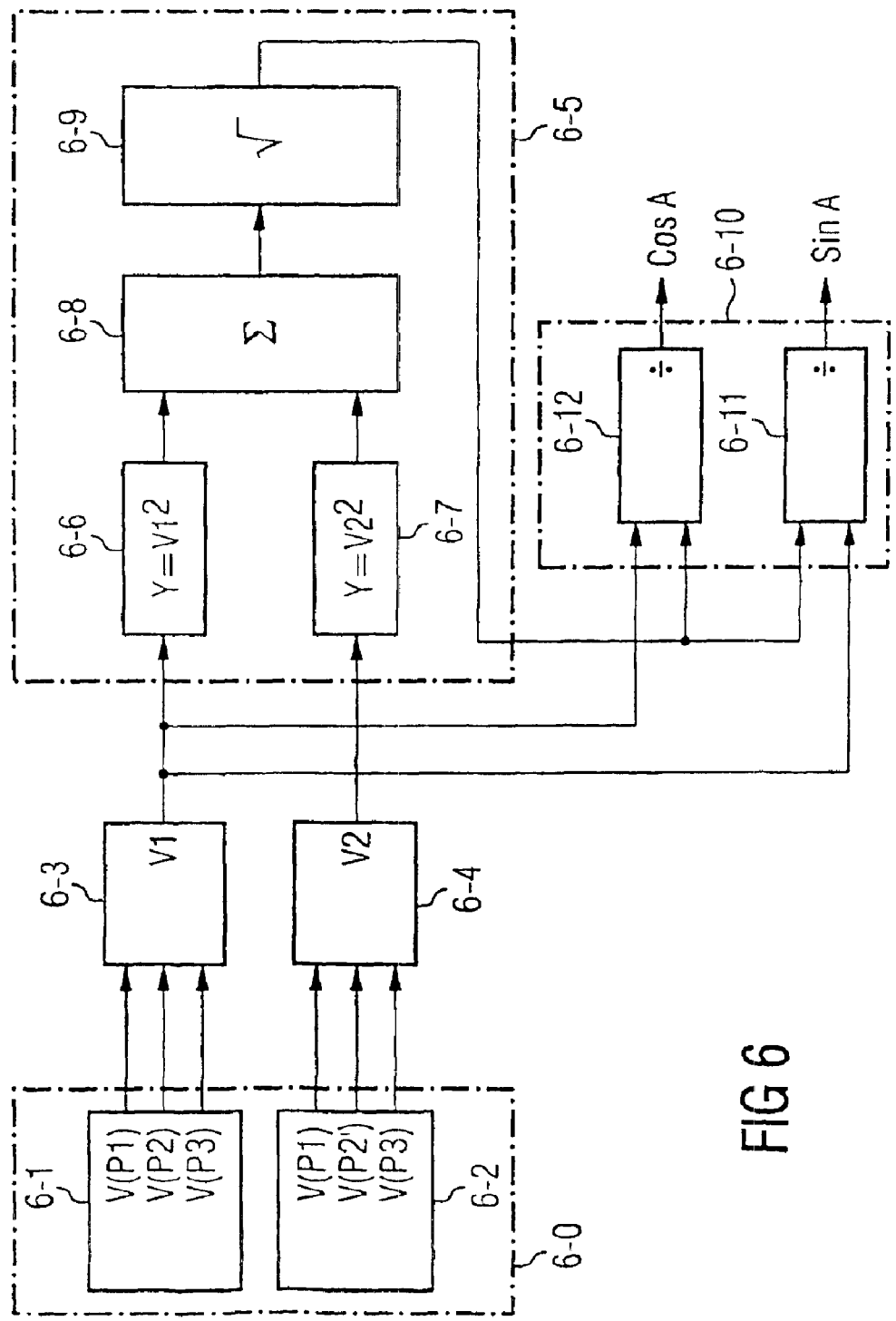
FIG. 6 is a schematic block diagram for inventive embodiment of the electronic circuit with GMR sensors for determining the orientation of an external magnetic field.

FIG. 6 schematically shows the structure of an inventive embodiment of the electronic circuit with GMR sensors for determining the angle α for the orientation of an external magnetic field. The sensor circuit 6-0 has two sensor sub-circuits 6-1 and 6-2, where the sensor circuit 6-0 preferably has a structure as in FIG. 4. The sensor circuit shown in FIG. 4 is particularly characterized by the anti-parallel internal magnetic orientation of the first and second GMR sensors within a sensor sub-circuit as well as by the vertical magnetic orientation of the two sensor sub-circuits relative to one another. Furthermore, the four GMR sensors preferably have largely the same fundamental resistance R0(T) and the same magneto-resistive resistance ΔR(T) as well as the same temperature dependency of the two parameters. Finally, the current through the first sensor sub-circuit 4-2 is preferably of the same size as the current through the second sensor sub-circuit 4-3. The current ultimately flows off in the current sink 4-12.

The difference circuit 6-3 of the first sensor sub-circuit 4-2 and the difference circuit 6-2 of the second sensor sub-circuit 4-3 respectively calculate the voltage differences between the sensor voltages V(P1), V(P2) and V(P3) or, respectively, V(P1), V(P2') and V(P3), as shown in FIG. 4, so that the difference voltages V1 and V2 are generated:

$$V1=\frac{1}{2}\Delta R(T)\cos \alpha$$

$$V2=\frac{1}{2}\Delta R(T)\sin \alpha$$

where α is the angle between the orientation of the external magnetic field 4-13 and the internal orientation of the first GMR sensor of the first sensor sub-circuit 4-14.

The difference voltages V1 and V2 are further-processed by the embodiment of the inventive electrical scaling circuit 6-5 shown in FIG. 6: V1 and V2 are first squared in parallel in the analog circuits 6-6 and 6-7 for squaring and the squared values are summed in an analog adder 6-8. Subsequently, the root of the square sum is taken in a circuit 6-9 for taking the square root. The circuit 6-9 for taking the square root is preferably an analog circuit. The output signal of the circuit for calculating the scaling factor is the scaling factor SQRT(V1$^2$+V2$^2$) that is introduced into the two dividers 6-10. An unscaled V1 and V2 value respectively exist simultaneously at inputs of the two dividers 6-11 and 6-12, so that a scaling of V1 or of V2 can be implemented:

$$V1_{sk}=V1/SQRT(V1^2+V2^2)=\cos \alpha \tag{11}$$

and $$V2_{sk}=V2/SQRT(V1^2+V2^2)=\sin \alpha \tag{12}$$

The scaled values are thus temperature-independent. The angle α can be unambiguously determined from them.

For the purposes of promoting an understanding of the principles of the invention, reference has been made to the preferred embodiments illustrated in the drawings, and specific language has been used to describe these embodiments. However, no limitation of the scope of the invention is intended by this specific language, and the invention should be construed to encompass all embodiments that would normally occur to one of ordinary skill in the art.

The present invention may be described in terms of functional block components and various processing steps. Such functional blocks may be realized by any number of hardware and/or software components configured to perform the specified functions. For example, the present invention may employ various integrated circuit components, e.g., memory elements, processing elements, logic elements, look-up tables, and the like, which may carry out a variety of functions under the control of one or more microprocessors or other control devices. Similarly, where the elements of the present invention are implemented using software programming or software elements the invention may be implemented with any programming or scripting language such as C, C++, Java, assembler, or the like, with the various algorithms being implemented with any combination of data structures, objects, processes, routines or other programming elements. Furthermore, the present invention could employ any number of conventional techniques for electronics configuration, signal processing and/or control, data processing and the like.

The particular implementations shown and described herein are illustrative examples of the invention and are not intended to otherwise limit the scope of the invention in any way. For the sake of brevity, conventional electronics, control systems, software development and other functional aspects of the systems (and components of the individual operating components of the systems) may not be described in detail. Furthermore, the connecting lines, or connectors shown in the various figures presented are intended to represent exemplary functional relationships and/or physical or logical couplings between the various elements. It should be noted that many alternative or additional functional relationships, physical connections or logical connections may be present in a practical device. Moreover, no item or essential to the practice of the invention unless the element is specifically described as "essential" or "critical". Numerous modifications and adaptations will be readily apparent to those skilled in this art without departing from the spirit and scope of the present invention.

What is claimed is:

1. A method for determining an orientation of an external magnetic field with giant magneto-resistor (GMR) sensors, comprising:

a) providing a sensor circuit comprising at least a first and a second sensor sub-circuit that are connected parallel to one another, the first and the second sensor sub-circuit each respectively comprising at least a first and a second GMR sensor that are connected in series and that are respectively arranged in opposite internal magnetic orientation, the internal magnetic orientation of the GMR sensors of the first sensor sub-circuit being essentially perpendicular to the internal magnetic orientation of the GMR sensors of the second sensor sub-circuit, the sensor circuit being fed by a current source, and draining through a current sink;

b) obtaining three respective sensor voltages from a first point, a second point, and a third point in the first and the second sensor sub-circuit, the first point lying on a connecting line from the current sink to the second GMR sensor, the second point lying on a connecting line from the second GMR sensor to the first GMR sensor, and the third point lying on the connecting line from the first GMR sensor to the current supply;

c) generating a first difference voltage using a first difference circuit from the three sensor voltages of the first sensor sub-circuit, and generating a second difference voltage from a second difference circuit from the three sensor voltages of the second sensor sub-circuit;

d) calculating a scaling factor from the first difference voltage and the second difference voltage; and e) determining the orientation of an external magnetic field by scaling the first difference voltage and the second difference voltage with the scaling factor.

2. The method according to claim 1, wherein current through the first sensor sub-circuit and current through the second sensor sub-circuit are substantially the same.

3. The method according to claim 1, wherein the first difference circuit and the second difference circuit have a substantially identical structure.

4. The method according to claim 1, wherein the scaling factor is the square root of the square sums of the first difference voltage and the second difference voltage or an approximation to this equation.

5. The method according to claim 4, further comprising providing an analog circuit configured to calculate squares of at least one of the first difference voltage and the second difference voltage.

6. The method according to claim 4, further comprising providing an analog circuit configured to calculate the square sum of the first difference voltage and the second difference voltage.

7. The method according to claim 4, further comprising approximating the calculation of the square root of the square sum of the first difference voltage and the second difference voltage with an analog circuit.

8. The method according to claim 1, further comprising scaling at least one of the first difference voltage and the second difference voltage by dividing the respective difference voltage by the scaling factor.

9. The method according to claim 1, further comprising calculating orientation angles of the external magnetic field utilizing at least one of scaled first difference voltage values and scaled second difference voltage values.

10. A system utilizing GMR sensors for determining the orientation of an external magnetic field, comprising:

a sensor circuit having a first and a second sensor sub-circuit, the first sensor sub-circuit being connected in parallel to the second sensor sub-circuit and the first and the second sensor sub-circuit each respectively comprise at least a first and a second GMR sensor that are connected in series and that are respectively arranged in opposite internal magnetic orientation relative to one another, the internal magnetic orientation of the GMR sensors of the first sensor sub-circuit is substantially perpendicular to the internal magnetic orientation of the GMR sensors of the second sensor sub-circuit, the sensor circuit being fed by a current source, and draining through a current sink;

wherein the first and the second sensor sub-circuit respectively comprise a first point, a second point, and a third point, the first point lying on a connecting line from the current sink to the second GMR sensor, the second point lying on a connecting line from the second GMR sensor to the first GMR sensor, and the third point lying on a connecting line from the first GMR sensor to the current supply, so that the three sensor voltages can be respectively taken at the three points;

the system further comprising a first and a second difference circuit, the first difference circuit configured to generate a first difference voltage from the three sensor voltages of the first sensor sub-circuit, and a second difference circuit being configured to generate a second difference voltage from the three sensor voltages of the second sensor sub-circuit; and a scaling circuit configured to read out the first difference voltage and the second difference voltage and to scale them such that the orientation of the external magnetic field can be determined from the scaled values.

11. The system according to claim 10, wherein current through the first sensor sub-circuit and current through the second sensor sub-circuit are substantially the same.

12. The system according to claim 10, wherein the first and the second differential circuit are substantially identical.

13. The system according to claim 10, wherein the scaling circuit comprises a circuit for calculating the scaling factor.

14. The system according to claim 13, wherein the scaling circuit comprises a circuit configured to calculate the square root of the square sum of the first difference voltage and the second difference voltage values or an approximation to this equation.

15. The system according to claim 10, wherein the scaling circuit comprises a circuit configured to scale the first difference voltage and the second difference voltage values.

16. The system according to claim 15, wherein the circuit for scaling the first difference voltage and the second difference voltage values comprises a circuit configured to divide the first difference voltage and the second difference voltage values by the scaling factor.

17. The system according to claim 10, further comprising at least one of an algorithm and data configured to calculate an angle for the orientation of the external magnetic field utilizing at least one of the scaled first difference voltage and second difference voltage values.

18. The system according to claim 10, wherein the scaling circuit comprises a circuit configured to calculate a scaled first difference voltage and second difference voltage value pair utilized to determine an orientation angle of the external magnetic field.

19. The system according to claim 10, wherein at least one circuit of the scaling circuit is integrated in an ASIC.

20. The system according to claim 10, further comprising a pre-amplification mechanism for at least one of the first difference voltage and second difference voltage.

* * * * *